(12) United States Patent
Hamlin

(10) Patent No.: US 11,329,664 B2
(45) Date of Patent: May 10, 2022

(54) SYSTEM AND METHOD FOR SIGNAL RESAMPLING

(71) Applicant: VIAVI SOLUTIONS INC., San Jose, CA (US)

(72) Inventor: Sean Hamlin, Wichita, KS (US)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

(21) Appl. No.: 17/215,534

(22) Filed: Mar. 29, 2021

(65) Prior Publication Data

US 2021/0218412 A1 Jul. 15, 2021

Related U.S. Application Data

(63) Continuation of application No. 16/720,852, filed on Dec. 19, 2019, now Pat. No. 10,972,121.

(60) Provisional application No. 62/782,481, filed on Dec. 20, 2018.

(51) Int. Cl.
| | |
|---|---|
| *H03M 1/06* | (2006.01) |
| *H03M 3/00* | (2006.01) |
| *G06F 1/02* | (2006.01) |
| *H03M 1/12* | (2006.01) |
| *H03M 1/10* | (2006.01) |

(52) U.S. Cl.
CPC ............ *H03M 3/414* (2013.01); *G06F 1/022* (2013.01); *H03M 3/322* (2013.01); *H03M 1/06* (2013.01); *H03M 1/1009* (2013.01); *H03M 1/12* (2013.01)

(58) Field of Classification Search
CPC ......... H03M 1/06; H03M 1/12; H03M 1/1009
USPC .............................. 341/118, 155, 120, 126
See application file for complete search history.

(56) References Cited

U.S. PATENT DOCUMENTS

| | | | |
|---|---|---|---|
| 4,053,739 A | 10/1977 | Miller et al. | |
| 4,475,851 A | 10/1984 | Borth | |
| 4,775,851 A * | 10/1988 | Borth ................. | H03H 17/0225 341/155 |
| 6,035,182 A * | 3/2000 | Shurboff ............. | H03K 23/667 327/117 |
| 6,208,671 B1 | 3/2001 | Paulos et al. | |
| 6,801,922 B2 | 10/2004 | Goszewski et al. | |
| 9,225,349 B2 | 12/2015 | Bourdi et al. | |
| 2008/0167564 A1 | 7/2008 | Hete | |

OTHER PUBLICATIONS

International Search Report cited in Application No. PCT/US19/067465 dated Mar. 18, 2020.
Written Opinion cited in Application No. PCT/US19/067465 dated Mar. 18, 2020.

* cited by examiner

*Primary Examiner* — Joseph J Lauture
(74) *Attorney, Agent, or Firm* — DLA Piper LLP (US)

(57) ABSTRACT

An instrument configured to process signal data is disclosed. The instrument is operable to control and or change the sampling rate of the signal data from a first sample rate to a second sample rate different than the first sample rate.

16 Claims, 7 Drawing Sheets

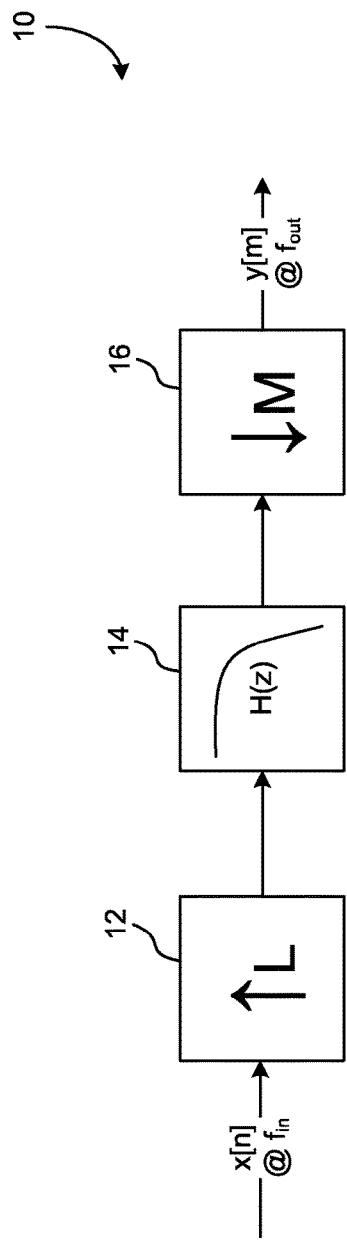
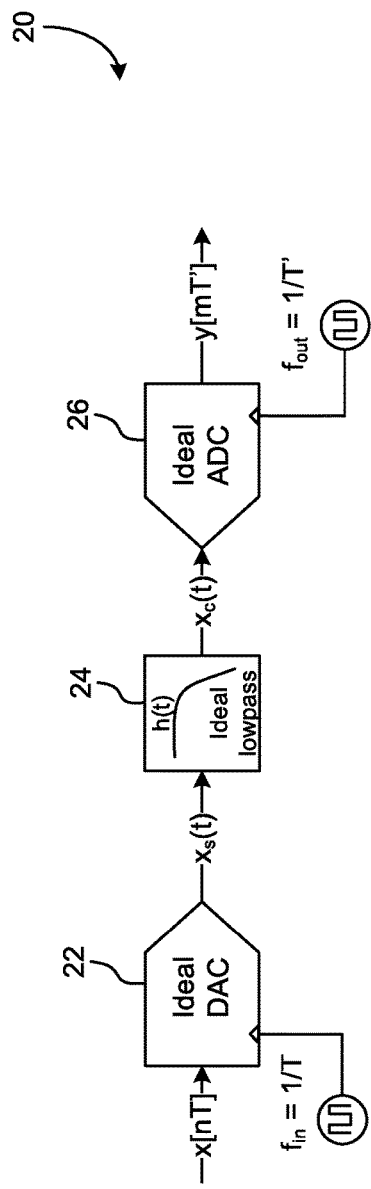
FIG 1
FIG 2

SYSTEM AND METHOD FOR SIGNAL RESAMPLING

CROSS REFERENCE TO RELATED APPLICATION

This application is a continuation application to U.S. application Ser. No. 16/720,852; filed Dec. 19, 2019, which claims priority to U.S. Provisional Application No. 62/782,481 filed Dec. 20, 2018, the entire disclosures of which are incorporated by reference herein.

TECHNICAL FIELD

The present disclosure relates generally to instrument systems and methods of signal processing, and, more specifically, instrument systems and methods of resampling signal data from a first sample rate to a second sample rate different than the first sample rate.

BACKGROUND

Signal processing and analysis, particularly radio frequency (RF) vector signal processing and analysis, is an essential aspect in today's highly technological world. Often times, signals are generated or recorded by one device and then processed and or analyzed by a separate test instrument. It may be desirable for the test instrument to be capable of signal processing and analysis in two different ways: 1) off-line with recorded signal data; and 2) real-time with an appropriate connection to the source of the signal data.

In some cases the sampling period T of the first device may be different than the sampling period T' of the second device. In these instances it is desired to perform a resampling algorithm in order to convert from T to T' without loss of information. In many instances, the conversion from the waveform's sample rate to the test instrument's sample rate is not easy to perform because the test instrument may have a predefined sample rate (e.g., 250 MHz), but the waveform's sample rate may not be an integer multiple of the test instrument's sample rate. The complexity of the resampling performed by the test instrument causes the process to be relatively slow, and or use too much memory and or processing resources to complete—all of which is undesirable.

Traditional rational resampling may not be appropriate. As shown in FIG. 1, a classical signal processing technique 10 for performing rational sample rate conversion includes two processing blocks 12, 16 and a digital lowpass filter 14 connected between the two blocks 12, 16. The rational sample rate conversion is performed by interpolating the signal data x[n] by an integer L in block 12 and decimating it by an integer M in block 16 to form the output y[m]. The digital lowpass filter 14 has a frequency cutoff that is driven by the function max[L,M].

In theory, the classical technique 10 for performing rational sample rate conversion provides conversion by any rational factor of L/M. This technique 10, however, has several shortcomings. While polyphase implementations may work to keep the computational effort low, a large L/M ratio can drive up coefficient storage and processing requirements, which is undesirable. Moreover, a programmable L/M ratio can complicate the hardware implementation of the technique 10. Additionally, sampling rates cannot be changed smoothly over time, and the implementation may not be convenient for managing variable group delay, among other things.

Accordingly, there is a need and desire for an improved signal resampling technique that may be used to convert a first sample rate to a second sample rate, while also allowing for sampling rates to be changed smoothly over time, without requiring large coefficient storage and processing requirements, and a complex hardware implementation.

SUMMARY

According to one aspect of the disclosure, a system for digital signal processing is disclosed. The system may include an instrument configured to process signal data by controlling and or changing the sampling rate of the signal data.

In one or more embodiments, an instrument configured to process first signal data may be provided. The instrument comprises: an input adapted to receive the first signal data, the first signal data having a first sample rate; and a controller connected to the input. In one or more embodiments, the controller may comprise: a shaping filter adapted to receive the first signal data from the input and transform, using a shaping function, the first signal data into second signal data having a second sample rate different than the first sample rate; and a timing controller adapted to control timing of the shaping filter using a dual-modulus counter.

In one or more embodiments, the dual-modulus counter may comprise a Multi-stAge noise Shaping Digital Delta-Sigma Modulator (MASH DDSM).

BRIEF DESCRIPTION OF THE DRAWINGS

The detailed description particularly refers to the following figures, in which:

FIG. 1 illustrates a classical signal processing re-sampling technique;

FIG. 2 is a block diagram illustration of an example of analog signal resampling, which in the ideal sense represents the Whittaker-Shannon interpolation technique;

DETAILED DESCRIPTION OF THE DRAWINGS

Figure 3:
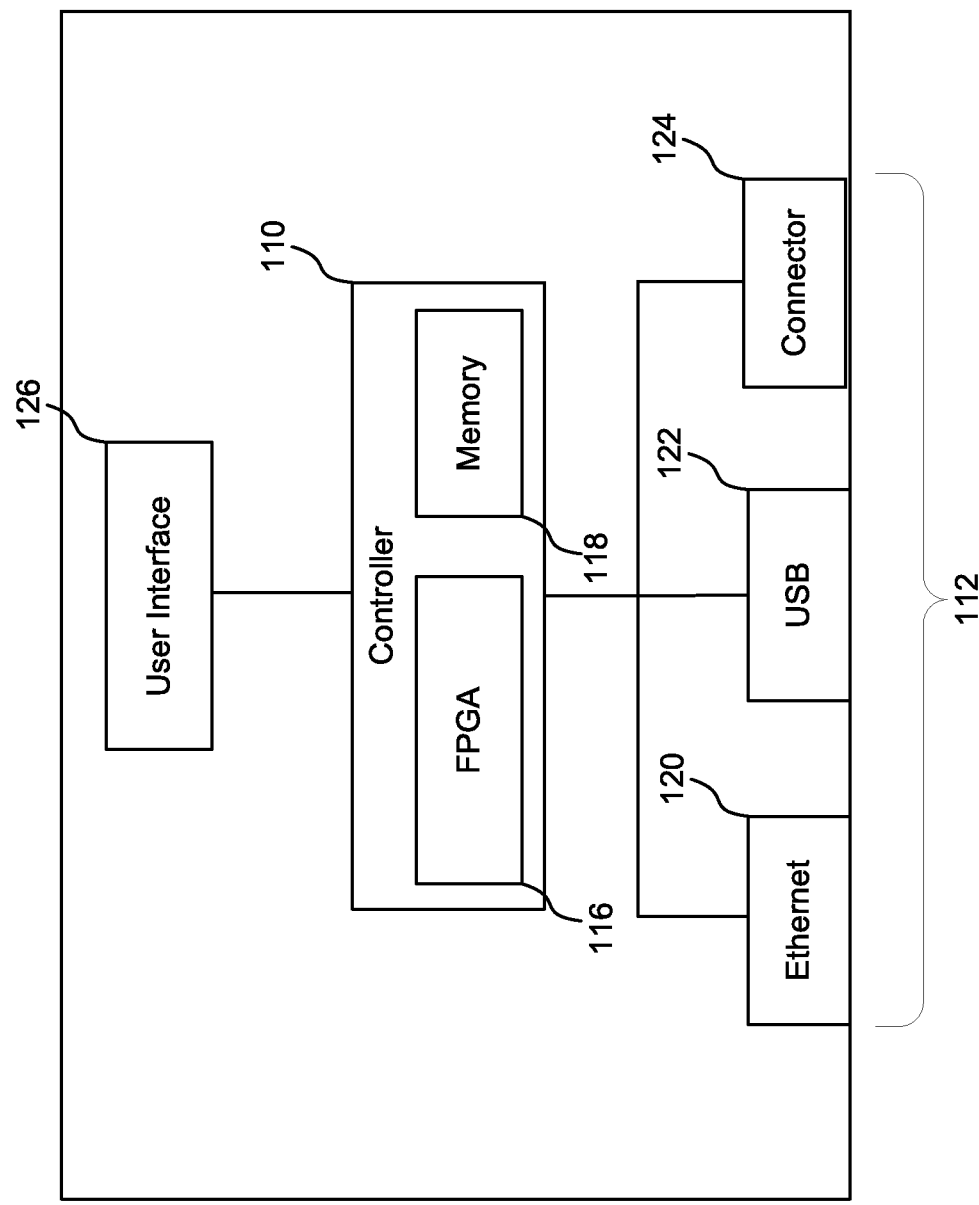
FIG. 3 is a simplified block diagram showing an example instrument for processing signal data in accordance with the disclosed principles.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

It is understood that perfect interpolation of a continuous-time, bandlimited function may be guaranteed in the analog domain, for example, by the Whittaker-Shannon interpolation technique 20 shown in FIG. 2. The technique 20 may include an ideal DAC (Digital-to-Analog Converter) 22, a perfect lowpass filter 24, and an ideal ADC (Analog-to-Digital Converter) 26. The input signal x[nT] is used as an input to the DAC 22, the output of the DAC 22 is used as an input to the lowpass filter 24 whose output is used as an input by the ADC 26. The output of the ADC 26 is interpolated output y[m T'].

The Whittaker-Shannon interpolation approach 20 can be visualized as reconstructing a bandlimited signal from the ideal DAC 22 using the perfect lowpass filter 24 and then resampling the signal at the new sample period T' with the ideal ADC 26. The ideal lowpass filter 24 perfectly bandlimits the sample sequence, x[nT], to the region $|f|<1/(2T)$ (i.e., a rectangular filter), and has an impulse response h(t) corresponding to the function sin(t)/t (i.e., the sinc(t) function).

The Paley-Wiener theorem dictates that any function that is time-limited cannot simultaneously be frequency limited. For perfect reconstruction, the filter kernel (i.e., the well-known sinc function) must have infinite support, but to make the problem tractable, the kernel must be replaced with one having finite support. This is typically done by windowing the sinc function accordingly (e.g., by a Lanczos algorithm, Kaiser window, etc.). For example, the Lanczos reconstruction kernel, h(t), is reproduced below:

$$h(t) = \begin{cases} \text{sinc}(t) \cdot \text{sinc}\left(\frac{t}{k}\right) & -k < t < k \\ 0 & \text{otherwise} \end{cases}$$

The windowing length typically coincides with the $k^{th}$ zero-crossing of the sinc function (sinc(0)=1, sinc(n)=0 for all other n integers).

Referring now to FIG. 3, an example of an instrument 100 for processing signal data in accordance with the disclosed principles is shown. In one or more embodiments, the instrument 100 may input signals and or waveforms having a first sample rate, which is different than the sample rate of the instrument 100 (e.g., because the signals may have been produced and or captured by a device having one or more sample rates different than the sample rate of the instrument 100). As discussed in more detail below, the instrument 100 may be configured to resample the input signal and process the signal with the sample rate of the instrument 100. In addition, the resampling may occur in real-time or in an offline manner and sampling rates may be changed smoothly over time in accordance with the disclosed principles.

In the illustrated example, the instrument 100 includes a controller 110 connected to a plurality of I/O ports 112 and to a user interface 126. In the illustrative embodiment, the controller 110 includes a Field Programmable Gate Array (FPGA) 116 (discussed in more detail below) and a storage device such as, for example, a memory 118. In one or more embodiments, the memory 118 may be configured to store recorded signal data and other data that may be accessed and or output by the FPGA 116. It should be appreciated that in other embodiments, the controller 110 may include other circuitry such as, for example, a microprocessor, processor, an application-specific integrated circuit (ASIC), ADC, and or a DAC.

In the illustrated example, the I/O ports 112 include an Ethernet port 120, a universal serial bus (USB) port 122, and a connector 124 for receiving an antenna (not shown). The I/O ports 112 permit the instrument 100 to transmit and receive signal and other data. In one embodiment, the I/O ports 112 may connect to a source of the signal data, which could be another device outputting real-time signal data or a storage device when the instrument 100 is used in an offline (i.e., non-real-time) manner. It should be appreciated that in other embodiments the instrument 100 may include other ports capable of transmitting and receiving data.

As shown in FIG. 3, the instrument 100 also includes the user interface 126, which may be operated by the user to control the operation of the instrument 100. In one or more embodiments, the user interface 126 may include a display and keyboard. It should be appreciated that in other embodiments the instrument 100 may be configured to be connected to peripherals such as a display monitor, keyboard, and mouse to permit a user to control the operation of the instrument 100.

The instrument 100 may be configured to process signal data that may include a number of different waveforms, and in many instances each waveform may have a different sample rate from that of the instrument 100. As described in greater detail below, the instrument 100 may be configured to resample the waveform's sample rate to the instrument's cardinal sample rate. To do so, the instrument 100 has logic that utilizes a windowed-sinc filter based on the following equation:

$$y[m] = \sum_{n=-\lfloor mp \rfloor - k+1}^{\lfloor mp \rfloor + k} x[n] \cdot h(mp - n), \; p = \frac{T'}{T}$$

The output sample (y) at time index m is constructed from the convolution of 2*k input samples with kernel values corresponding to the appropriate time index. With a windowed sinc function, the number of required filter coefficients scales with the interpolation ratio, p, and the instrument 100 may be configured to interpolate the filter kernel value (i.e., the windowed sinc function value) according to the time index from a lookup table of kernel values. In one or more embodiments, the interpolation used by instrument 100 may be linear interpolation. It should be appreciated, however, that other interpolation stategies (cubic, quadratic, Farrow-type) may be used in other embodiments. Generally, higher order interpolation trades fewer kernel values in the lookup table for greater computational effort.

Figure 4:
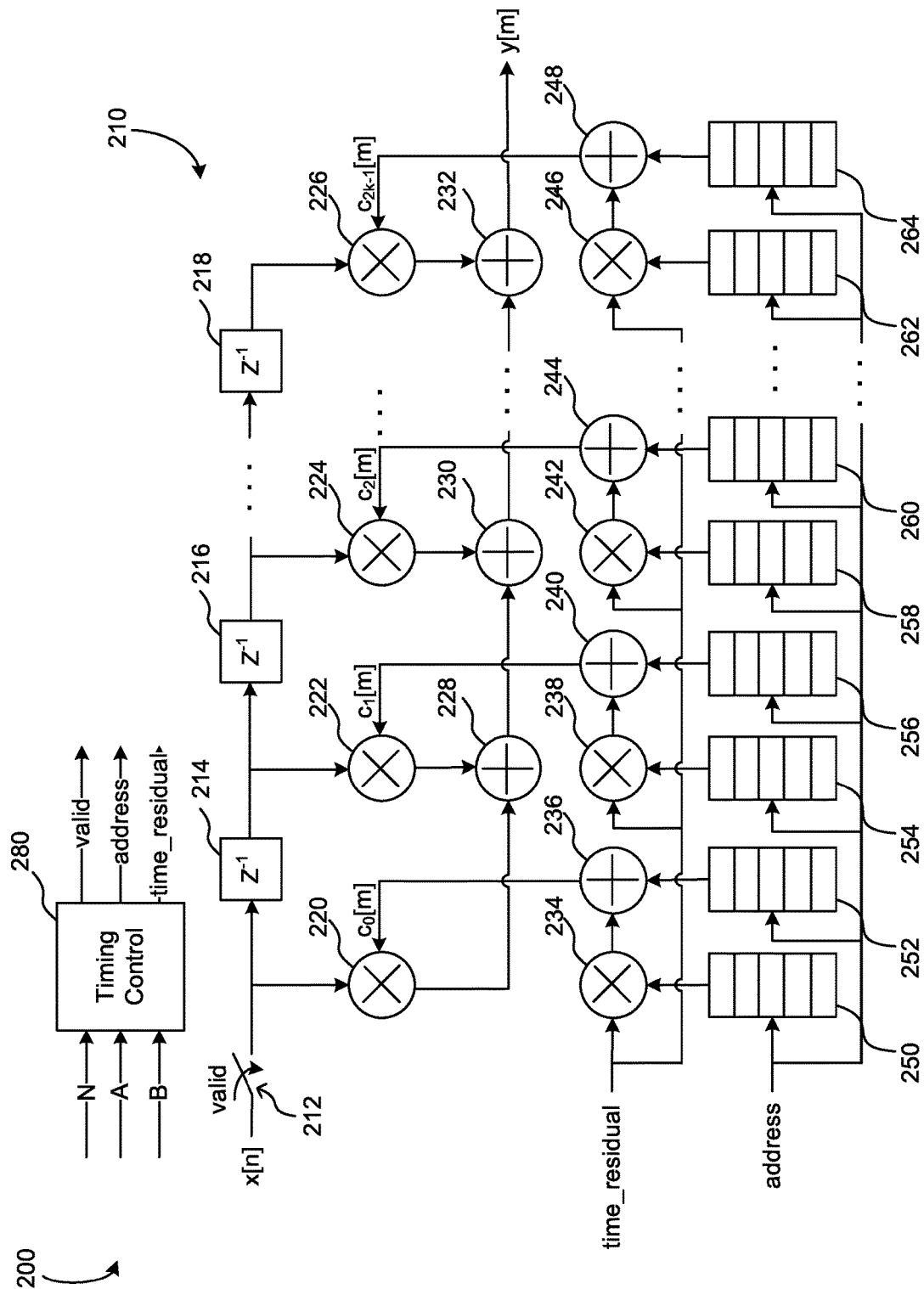
FIG. 4 is a simplified block diagram of logic for performing a re-sampling process that may be utilized by the instrument of FIG. 3 in accordance with the disclosed principles.

Referring now to FIG. 4, which is a block diagram illustrates an example of the logic 200 that may be used by the instrument 100 to implement the resampling process performed in accordance with the disclosed principles. In one or more embodiments, the resampling process, and hence the logic 200 illustrated in FIG. 4, may utilize a form of interpolation to process signal data as described below in more detail. In one or more embodiments, the logic 200 is implemented in the FPGA 116.

As shown in FIG. 4, the logic 200 may include a shaping filter implemented as a windowed-sinc filter 210 and a timing controller 280 for controlling the windowed-sinc filter 210. In the illustrated embodiment, the windowed-sinc filter 210 includes a switch 212 controlled by a "valid" signal output from the timing controller 280. When the resampling filter requires a new input sample the valid signal momentarily closes the switch 212.

When in the closed position, the switch 212 connects the input signal x[n] to a delay line structure composed of a series of registers 214, 216, 218 and also to a first multiplier 220. Each register 214, 216, 218 may introduce a one timing sample delay to the data it inputs. It should be appreciated that the length of the filter (and by extension the delay line, multipliers, adders, etc.) can be arbitrarily large, as indicated by the ellipses in the figures. The output of register 214 is input into register 216. The output of register 216 is input into register 218. In addition, the output of each register 214, 216, 218 is used as an input to a respectively connected multiplier 222, 224, 226. The multipliers 220, 222, 224, 226 each receive another input signal, shown as coefficients $c_0[m]$, $c_1[m]$, $c_2[m]$, $c_{2k-1}[m]$ (explained below in more detail). The outputs of the multipliers 220, 222, 224, 226 are summed together through a series of adders 228, 230, 232. In the illustrated embodiment, the output of adder 232 is the resampled waveform output signal y[m].

Other logic in the windowed-sinc filter 210 may include additional multipliers 234, 238, 242, 246 and adders 236, 240, 244, 248 as well as memories 250, 252, 254, 256, 258, 260, 262, 264. In one or more embodiments, multipliers 234, 238, 242, 246 use the time residual ("time_residual") signal output from the timing controller 280 as one of their inputs.

In one or more embodiments, the memories 250, 252, 254, 256, 258, 260, 262, 264 are read only memories (ROMs). In one or more embodiments, the memories 250, 252, 254, 256, 258, 260, 262, 264 may include precomputed filter kernel values (kernel[addr]) stored for each zero-crossing along with the difference value (kernel_diff[addr] =kernel[addr+1]−kernel[addr]) among the kernel values. In the illustrated embodiment, memories 250, 254, 258, 262 may respectively store the difference values kernel_diff$_0$[addr], kernel_diff$_1$[addr], kernel_diff$_2$[addr], kernel_diff$_{2k-1}$[addr] while memories 252, 256, 260, 264 may respectively store the kernel values kernel$_0$[addr], kernel$_1$[addr], kernel$_2$[addr], kernel$_{2k-1}$[addr].

In the illustrated embodiment, the memories 250, 252, 254, 256, 258, 260, 262, 264 are indexed by the "address" signal output from the timing controller 280. In one or more embodiments, the outputs of memories 250, 254, 258, 262 (e.g., difference values kernel_diff$_0$[addr], kernel_diff$_1$[addr], kernel_diff$_2$[addr], kernel_diff$_{2k-1}$[addr]) are used as inputs by multipliers 234, 238, 242, 246, respectively. In one or more embodiments, the outputs of memories 252, 256, 260, 264 (e.g., kernel values kernel$_0$[addr], kernel$_1$[addr], kernel$_2$[addr], kernel$_{2k-1}$[addr]) are used as inputs by adders 236, 240, 244, 248.

In one or more embodiments, coefficient $c_0[m]$ may be generated via linear interpolation by adding the output of multiplier 234 (e.g., time_residual*kernel_diff$_0$[addr]) to the memory 252 output (e.g., kernel$_0$[addr]) at adder 236, coefficient $c_{01}[m]$ may be generated by adding the output of multiplier 238 (e.g., time_residual*kernel_diff$_1$[addr]) to the memory 256 output (e.g., kernel$_1$[addr]) at adder 240, coefficient $c_2[m]$ may be generated by adding the output of multiplier 242 (e.g., time_residual*kernel_diff$_2$[addr]) to the memory 260 output (e.g., kernel$_2$[addr]) at adder 244 and coefficient $c_{2k-1}[m]$ may be generated by adding the output of multiplier 246 (e.g., time_residual*kernel_diff$_{2k-1}$[addr]) to the memory 264 output (e.g., kernel$_{2k-1}$[addr]) at adder 248.

Figure 5:
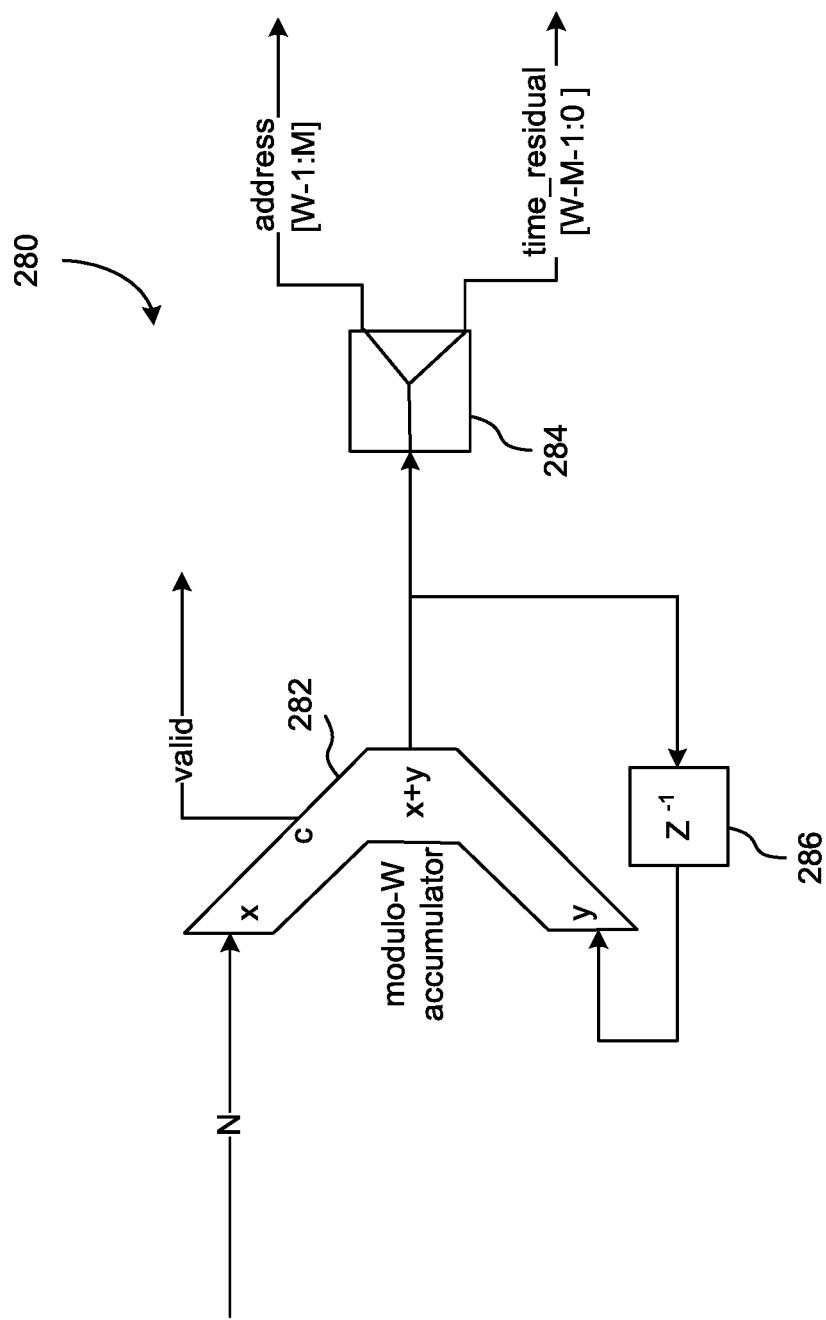
FIG. 5 is a simplified block diagram of an example timing controller that may be used in the re-sampling implementation of FIG. 4 in accordance with the disclosed principles.

In one or more embodiments, the windowed-sinc filter 210 may be controlled by the timing controller 280 that produces the "valid", "address," and "time_residual" signals (discussed above) from a counter that represents the current sample time. As shown in FIG. 5, one example of the timing controller 280 (also referred to herein as timing control or timing state machine) includes a counter 282, splitter 284 and register 286.

In one or more embodiments, the counter 282 may be implemented as an error feedback modulator (i.e., modulo-$2^W$) having a first input (x) for receiving an integer N and a second input (y) for receiving a feedback signal from the register 286. In one embodiment, the counter 282 may increment by the value of integer value N, which in one or more embodiments may correspond to the nearest integer expressed by the resampling ratio p (i.e., $N=p*2^W$). In one or more embodiments, the carry bit (c) of the counter 282 may be used as the "valid" signal because it indicates the rollover of the time value and the acceptance of a new sample into the windowed-sinc filter 210. In one embodiment, $2^M$ precomputed filter kernel values are stored in the memories 250, 252, 254, 256, 258, 260, 262, 264 (FIG. 4) for each zero-crossing along with the difference value among the kernel values according to the following:

kernel_diff[addr]=kernel[addr+1]−kernel[addr], where addr=[0:2$^{M-1}$]

In one or more embodiments, the splitter 284 contains logic to split the counter 282 output (x+y) into the "address" signal and "time_residual" signal discussed above. For example, in one embodiment, the M-most significant bits from the counter 282 output (x+y) form the "address" that is used as an index into the kernel memories 250, 252, 254, 256, 258, 260, 262, 264 (FIG. 4) for each zero-crossing. In one embodiment, the W-M least significant bits from the counter 282 output (x+y) form the "time_residual" signal and represent the residue from the ideal kernel time value and the stored kernel value such that time_residual for output sample m for resample rate p is given by m*p−floor (m*p). As noted above, the coefficients $c_g[m]$ for the time value are formed using linear interpolation:

$c_g[m]$=time_residual*kernel_diff$_g$[addr]+kernel$_g$ [addr], where g=[0:2k−1].

The aforementioned logic 200 can achieve an arbitrary amount of interpolation accuracy with a sufficiently large time counter register width, W. However, the actual interpolation rate error cannot be made identically zero for rates that cannot be expressed exactly as a ratio of $N/2^W$. For many applications, this may not be an issue as the length of the waveform may be small enough that sub-hertz interpolation rate errors are not significant. For signals that are observed over significant time periods, however, the interpolation rate error may accumulate, causing increasing errors in time accuracy. Thus, the logic 200 may be improved upon to further the disclosed principles.

The inventor has determined that additional accuracy may be achieved through the use of a dual-modulus counter in the timing control logic. For example, a dual modulus counter may be implemented such that $p=T'/T=f_{in}/f_{out}$ such that inputs N, A, and B to the timing controller may be calculated using the following equations:

$$p=[N+A/B]/2^W$$

$$N=\text{floor}(p*2^W)$$

$$A=[f_{in}*2^W-N*f_{out}]/Q$$

$$B=f_{out}/Q$$

$$Q=GCD[f_{out}, f_{in}*2^W-N*f_{out}]$$

where:

$f_{in}$ is the baseband sample rate of the target waveform, $f_{out}$ is the sample rate of the instrument 100 (e.g., 250 MHz), and W is a constant (e.g., 32).

Effectively, the time counter increments by N for B-A cycles, then counts by N+1 for A cycles, which may yield an average increment value of N+A/B. One potential drawback of this approach is that aliased frequency content may appear at multiples of A/B from the output frequency. Accordingly, in one or more embodiments, the dual-modulus action of the time counter may be "dithered" to break-up the spurious content and spread it out over frequency.

Figure 6:
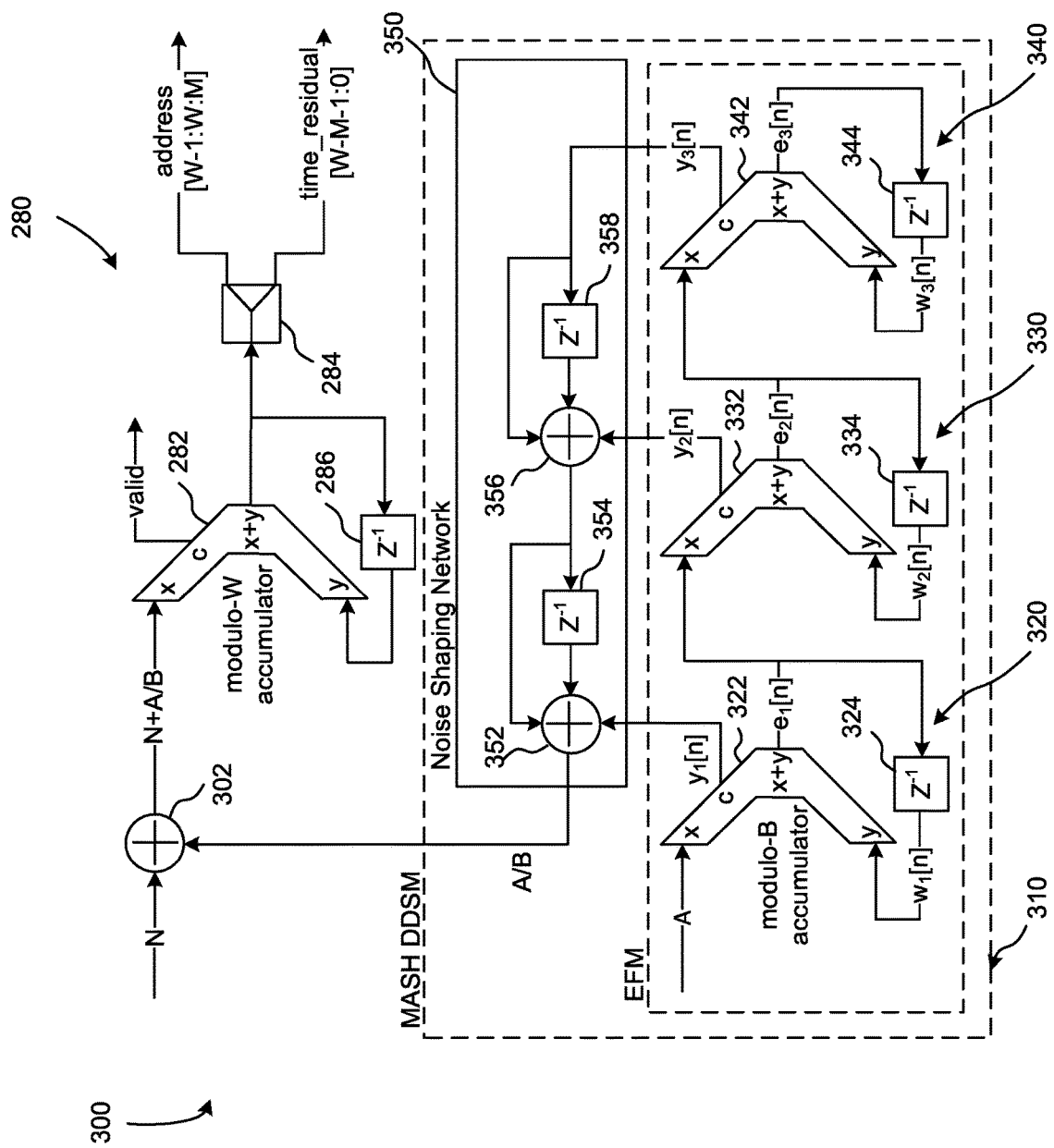
FIG. 6 is a simplified block diagram of an example of the timing control logic and an example of a Multi-stAge noise Shaping Digital Delta-Sigma Modulator (MASH DDSM) that may be used in the re-sampling logic of FIG. 4 in accordance with the disclosed principles.

Accordingly, in one or more embodiments, the logic of the FPGA 116 may utilize a Multi-stAge noise Shaping Digital Delta-Sigma Modulator (MASH DDSM) 310, as shown in FIG. 6, to break-up the spurious content and spread it out over frequency in accordance with the disclosed principles. The MASH DDSM 310 is included in a novel timing state machine or timing control logic 300 that outputs "valid," "address" and "time_residual" signals that may be used to control windowed-sinc filter 210 (FIG. 4).

In the illustrated embodiment, the MASH DDSM 310 includes a plurality of error feedback modulators (EFMs) 320, 330, 340 connected to a noise shaping network 350. In the illustrated embodiment, the first EFM 320 has a modulo-B accumulator 322 and a register 324. The modulo-B accumulator 322 has an input (x) connected to receive the A signal and a second input (y) connected to receive a feedback signal $w_1[n]$ from the register 324. The register 324 inputs $e_1[n]$ from the modulo-B accumulator 322 output (x+y) and introduces a one sample delay forming feedback signal $w_1[n]$.

In the illustrated embodiment, the second EFM 330 has a modulo-B accumulator 332 and a register 334. The modulo-B accumulator 332 has an input (x) connected to receive $e_1[n]$ from the modulo-B accumulator 322 output (x+y) and a second input (y) connected to receive a feedback signal $w_2[n]$ from the register 334. The register 334 inputs $e_2[n]$ from the modulo-B accumulator 332 output (x+y) and introduces a one sample delay forming feedback signal $w_2[n]$.

In the illustrated embodiment, the third EFM 340 has a modulo-B accumulator 342 and a register 344. The modulo-B accumulator 342 has an input (x) connected to receive $e_2[n]$ from the modulo-B accumulator 332 output (x+y) and a second input (y) connected to receive a feedback signal $w_3[n]$ from the register 344. The register 344 inputs $e_3[n]$ from the modulo-B accumulator 342 output (x+y) and introduces a one sample delay forming feedback signal $w_3[n]$.

The carry bits $y_1[n]$, $y_2[n]$, $y_3[n]$ output from the carry bit (c) portion of EFMs 320, 330, 340 are output to the noise shaping network 350. In the illustrated embodiment, the noise shaping network 350 comprises two adders 352, 356 and two registers 354, 358. The first adder 352 may input the carry bit $y_1[n]$ from the first EFM 320 and the second adder 356 may input the carry bit $y_2[n]$ from the second EFM 330 and the second register 358 may input the carry bit $y_3[n]$ from the third EFM 340.

The output of the second register 358, which is a delayed carry bit $y_3[n]$, is added to the carry bit $y_2[n]$ from the second EFM 330 and the carry bit $y_3[n]$ from the third EFM 330 at adder 356. The output of adder 356 is input by register 354. The output of register 354, which is a delayed summation from adder 356, is added to the carry bit $y_1[n]$ from the first EFM 320 and the summation from adder 356 at adder 352. The output of adder 352 is the A/B signal, which has an instantaneous value that varies according to the order of the MASH DDSM, but whose average value over time corresponds to the ratio A/B and is used as an input by adder 302. The output of adder 302, which may be N+A/B is used as an input (x) of the accumulator 282 of timing controller 280.

Generally, each error feedback modulator 320, 330, 340 is a delta-sigma modulator and uses a feedback loop, which computes the difference between its input signal and the previous quantized output (delta) followed by a discrete integrator/accumulator (sigma). The implementation of each 1st order EFM is a modulo-B accumulator, where the error feedback is the modulus resulting from any overflow. The theory of operation of the EFMs 320, 330, 340 may be understood from the example diagrammatic representations 420, 520 shown in FIGS. 7 and 8, respectively.

Figure 7:
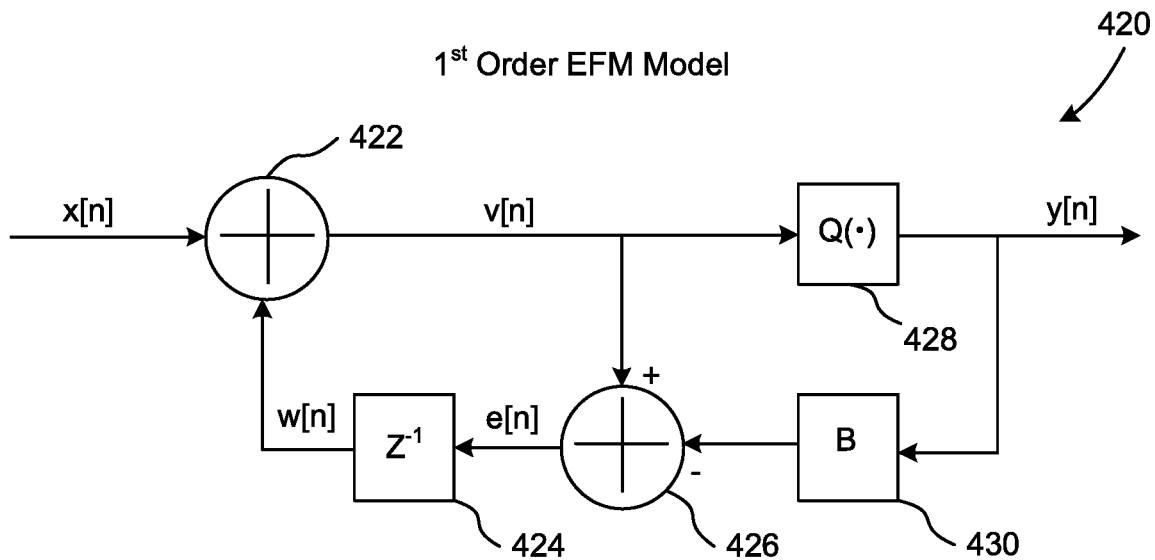
FIG. 7 illustrates a diagrammatic representation of an example error feedback modulator (EFM) that may be used in the MASH DDSM of FIG. 6 in accordance with the disclosed principles.

For example, FIG. 7 illustrates a first order EFM model 420 comprising two adders 422, 426, feedback/delay register 424 and processing blocks 428, 430. The input x[n] is added to a feedback signal w[n] at adder 422. The output v[n] of adder 422 is input at block 428 whose output y[n] is the output of the EFM 420. The output y[n] is fed into block 430 whose output is input by a negative terminal of adder 426. Adder 426 also inputs the output v[n] from adder 422 to create output e[n] that is fed to the register 424 that outputs the feedback signal w[n] to adder 422. The following variables may be computed during the process:

$$y[n] = Q(v[n]) = \begin{cases} 1 & v[n] \geq B \\ 0 & v[n] < B \end{cases}$$

$$w[n+1] = (x[n] + w[n]) \bmod B$$

Figure 8:
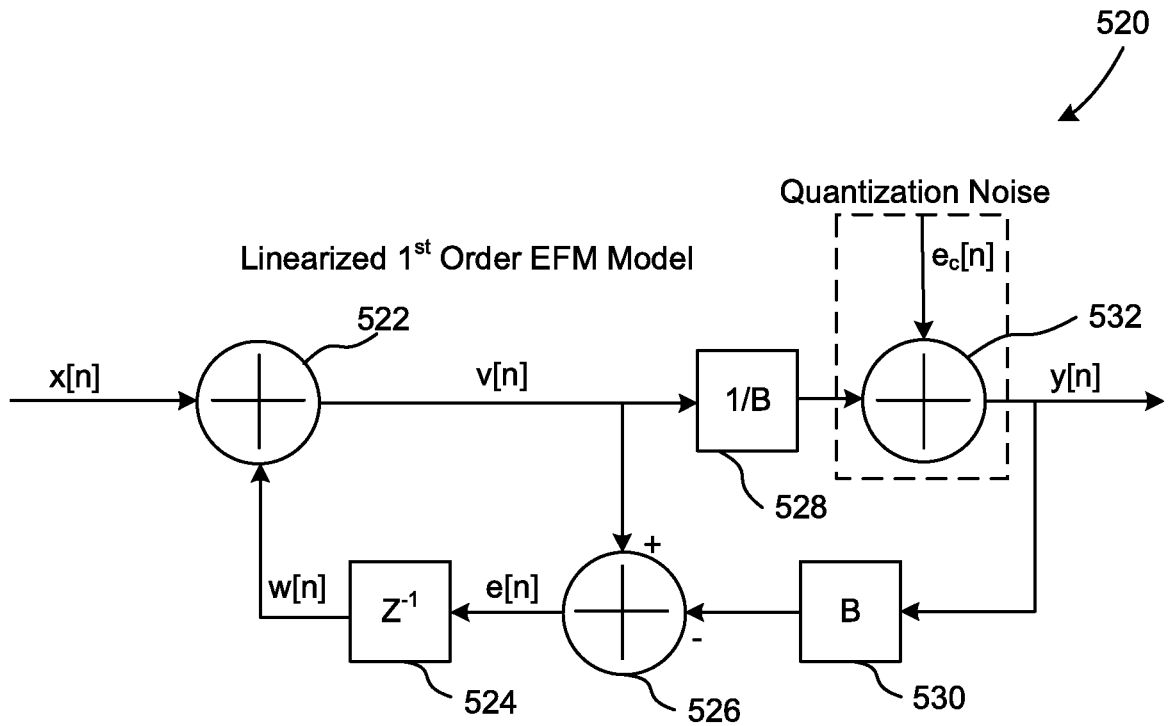
FIG. 8 illustrates a diagrammatic representation of an example linearized EFM that may be used in the analysis of the MASH DDSM of FIG. 6 in accordance with the disclosed principles.

FIG. 8 illustrates a linearized first order EFM model 520 comprising three adders 522, 526, 532, feedback/delay register 524 and processing blocks 528, 530. The input x[n] is added to a feedback signal w[n] at adder 522. The output v[n] of adder 522 is input at block 528 whose output is fed to adder 532. The other input of adder 532 receives the quantization noise $e_c[n]$. The output adder 532 is the output y[n] of the EFM 520. The output y[n] is fed into block 530 whose output is input by a negative terminal of adder 526. Adder 526 also inputs the output v[n] from adder 522 to create output e[n] that is fed to the register 524 that outputs the feedback signal w[n] to adder 522. In the linearized model, the non-linear modulus operator, Q(•), of the EFM 520 is absorbed as quantization noise, $e_q[n]$. The average output of the carry signal, y[n], is the value x[n]/B. The following variables may be computed during the process:

$$y[n] = \left(\frac{1}{B}\right)v[n] + e_q[n]$$

$$e[n] = v[n] - B \cdot y[n] = -B \cdot e_q[n]$$

-continued $$y[n] = (x[n] + w[n]) \cdot \left(\frac{1}{B}\right) + e_q[n]$$

$$= \frac{x[n]}{B} + e_q[n] - e_q[n-1]$$

Figure 9:
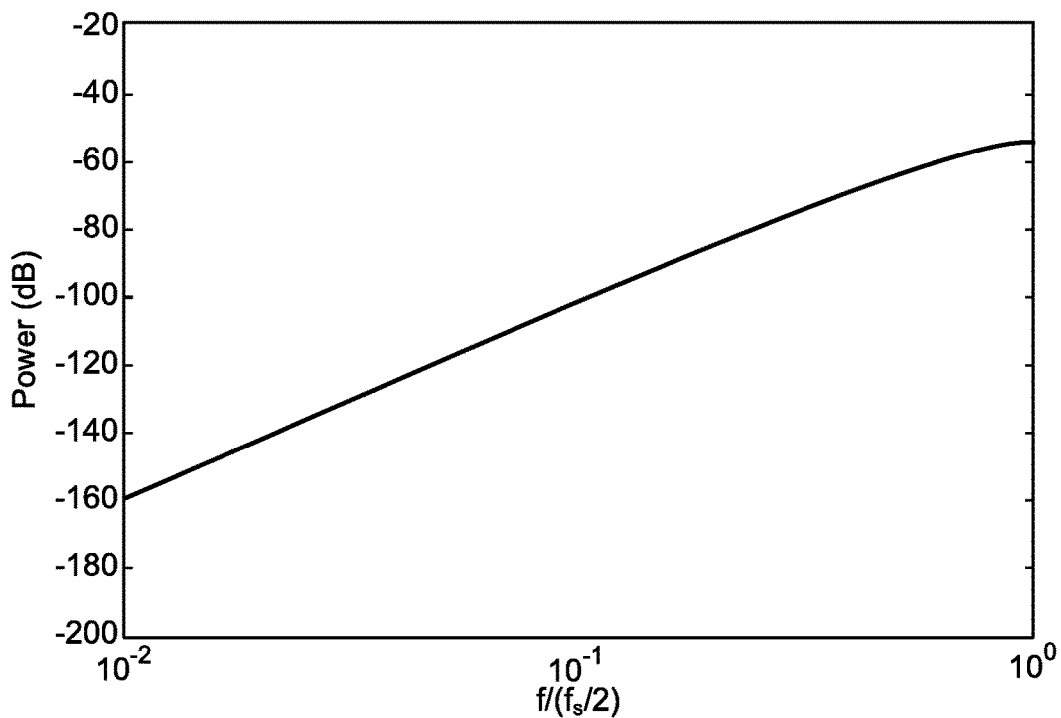
FIG. 9 is an illustrative graph of noise power spectral density of an EFM of the MASH DDSM of FIG. 6 in accordance with the disclosed principles.

Referring again to FIG. 6, the error feedback modulators 320, 330, 340 of the MASH DDSM 310 are cascaded, with outputs that are fed into the noise shaping network 350. The noise shaping network 350 consists of cascaded differentiators which possess a transfer function with a highpass response. The differentiators perfectly cancel the quantization noise of the previous EFM. The noise is shaped by the highpass response of the differentiator network, resulting in the noise spectral density being minimized at 0 Hz and increasing towards the Nyquist frequency. This result is displayed by the graph shown in FIG. 9.

The theory of operation of a MASH DDSM may be explained by first analyzing the operation of the 1st order Error Feedback Modulator (EFM) 420, shown in FIG. 7. The 1st order EFM consists of a digital accumulator with modulus B, input x[n], registered state w[n], and output y[n] (the carry out bit of the accumulator). According to FIG. 7 the state of the EFM 420 is given by:

$$w[n+1] = (x[n] + w[n]) \bmod B$$

The output of the EFM 420 is given by:

$$y[n] = Q(v[n]) = \begin{cases} 1 & v[n] \geq B \\ 0 & \text{else} \end{cases}$$

The non-linear modulus operator $Q(\cdot)$ 428 of the modulo-B accumulator can be linearized by the approximation:

$$Q(v[n]) = \frac{1}{B} \cdot v[n] + e_q[n],$$

where $e_q[n]$ is quantization with a uniform spectral density. The linearized 1st order EFM Model 520 diagrammatic representation is given in FIG. 8. The error signal e[n] is then given by:

$$e[n] = v[n] - B \cdot y[n] = -B \cdot e_q[n],$$

Subsequently, the output y[n] of the EFM 520 is shown to be:

$$y[n] = \frac{x[n]}{B} + e_q[n] - e_q[n-1],$$

which has the z-transform equivalent of:

$$Y[z] = \frac{X[z]}{B} + E_q[z](1 - z^{-1}).$$

A MASH DDSM 310 network consists of several cascaded EFM 420.

Figure 10:
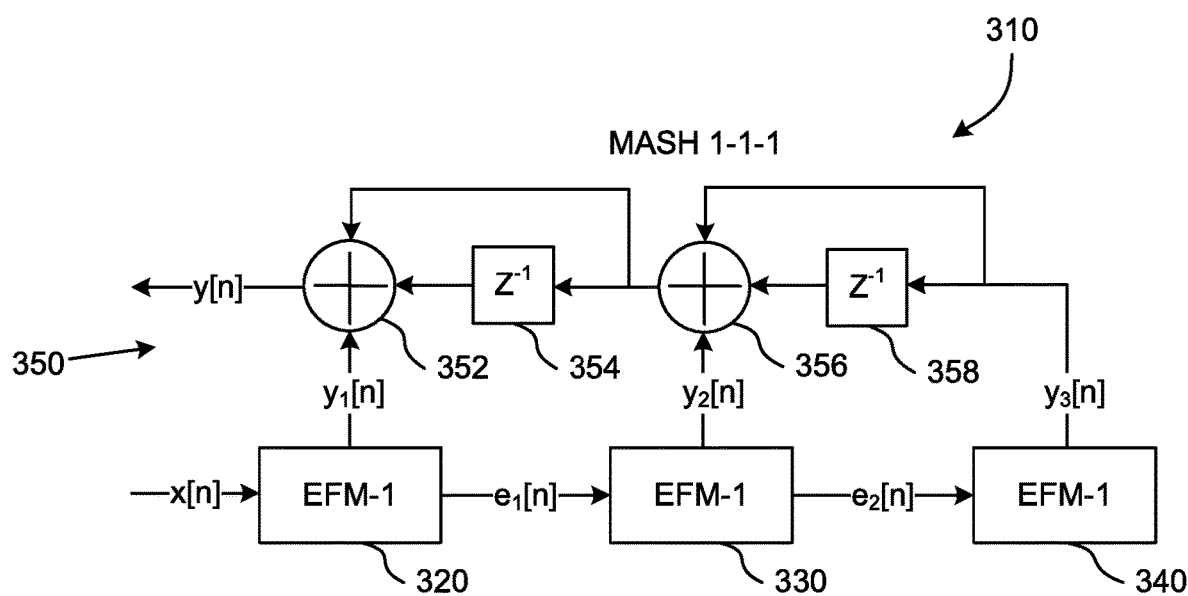
FIG. 10 illustrates a diagrammatic representation of an example of the MASH DDSM of FIG. 6 in accordance with the disclosed principles.

The accumulator output signal, e[n], of each EFM is fed to the subsequent EFM. The carry output signal, y[n], of each EFM is fed to a noise shaping network. The cascade of three 1st order EFMs with noise shaping network (MASH 1-1-1 DDSM 310) is illustrated in FIG. 10. The noise shaping network consists of a cascade of digital differentiators. The differentiators of FIG. 10 cancel the noise of the intermediate EFM error signal, $e_1[n]$ and shape the quantization noise of the final EFM according to a highpass response:

$$Y(z) = Y_1(z) + (1 - z^{-1}) \cdot Y_2(z) + (1 - z^{-1})^2 \cdot Y_3(z)$$

$$= \frac{X(z)}{B} + (1 - z^{-1})^3 \cdot E_{q_3}(z)$$

The theory of operation of the 1-1-1 MASH DDSM 310 may be explained by the diagrammatic representation in FIG. 10. For example, the MASH DDSM 310 may be a 1-1-1 MASH DDSM and may include three 1st order EFMs 320, 330, 340 whose respective outputs $y_1[n]$, $y_2[n]$, $y_3[n]$ are fed to the nose shaping network 350. The non-linear modulus operator, Q( ), of the modulo-B accumulators can be assumed to quantization noise with a uniform spectral density. The quantization noise $e_1[n]$ from the first EFM 320 is input into the second EFM 330 whose quantization noise $e_2[n]$ is input into the third EFM 340. Register 358 inputs the output $y_3[n]$ and delays it by one time sample before it output to adder 356. Adder 356 also inputs the original output $y_3[n]$. The output of adder 356 ($y_2[n] + y_3[n] +$ delayed $y_3[n]$) is input at register 354, which delays it by one time sample, and outputs the delayed result to adder 352. Adder 352 adds the output y1[n] from EFM 320, the original output from adder 356 and the delayed output from adder 356 (via register 354) to form the output y[n].

In one or more embodiments, the inclusion of the MASH DDSM 310 to the time counter integer component overcomes any restriction of perfect rate interpolation for those rates expressible as a ratio of the counter modulus. Any potential MASH DDSM noise is pushed out to the Nyquist frequency and is naturally attenuated by the filter lowpass response. Additionally, the MASH DDSM provides shaped dither noise that improves spurious generation in the filter response as a result of coefficient quantization. The modulus (B) of the MASH DDSM in accordance with the disclosed principles may be programmable to any value up to the maximum MASH accumulator counter width, expanding further the achievable interpolation rates.

It should be appreciated that the MASH DDSM implementation is only one approach for adding shaped noise for the purpose of time-variant filtering. Shaped noise is typically realized via delta-sigma modulation, of which the MASH implementation is one, but not exclusive, means of generating the sequence. In other embodiments, other methods of intentionally adding noise to a filter implementation, which is at a low level and shaped to be rejected by the filtering action itself, may be used to improve resampling and processing of the signal data.

It should be appreciated that the applications for the approaches described above are broad and extend beyond the instrumentation described above to include digital audio, image or video resampling, and other digital signal applications.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. An instrument comprising:
   a multi-stage filter adapted to receive a first waveform having a first sample rate, the filter comprising a shaping function adapted to re-sample the first waveform into a second waveform having a second sample rate different than the first sample rate; and
   a timing controller adapted to control timing of the multi-stage filter using a dual-modulus counter,
   wherein the timing controller comprises a state machine and the dual-modulus counter comprises a Multi-stAge noise Shaping Digital Delta-Sigma Modulator (MASH DDSM) connected to the state machine and receiving signals for controlling the MASH DDSM from the state machine.

2. The instrument of claim 1, wherein the second sample rate is a sample rate of the instrument, which is different than the first sample rate.

3. The instrument of claim 1, wherein the MASH DDSM comprises:
   a plurality of cascaded error feedback modulators (EFMs), each error feedback modulator (EFM) feeding a noise shaping network;
   the noise shaping network adapted to cancel the quantization error of the preceding EFM while shaping the quantization error of the final EFM according to a highpass filter response, the output of which represents the fractional component of the resampling rate; and
   a timing accumulator that accumulates integer components and the fractional components of the desired resampling rate used to derive control signals for the state machine.

4. The instrument of claim 3, wherein each EFM comprises a modulo-B accumulator having a carry out bit.

5. The instrument of claim 4, wherein each EFM further comprises a feedback loop adapted to compute a difference between an input signal and a previous quantized output signal followed by a discrete integrator or accumulator.

6. The instrument of claim 3, wherein the noise shaping network comprises cascaded differentiators adapted to cancel quantization noise from the EFMs.

7. The instrument of claim 3, each comprising filter kernel values stored for each zero-crossing or tapped delay output of the filter;
   a plurality of second memories, each comprising values used for interpolation of the filter kernel, the first and second memories being accessed using the address signal from the timing controller; and
   combining logic adapted to input the time residual signal from the timing controller and use filter kernel values from the first memories and values from the second memories to interpolate filter coefficients to be applied to the first waveform to form the second waveform having the second sample rate according to an assertion of control signals from the timing controller state machine.

8. An instrument comprising:
   a multi-stage filter adapted to receive a first waveform having a first sample rate, the filter comprising a shaping function adapted to re-sample the first waveform into a second waveform having a second sample rate different than the first sample rate; and
   a timing controller adapted to control timing of the multi-stage filter using a dual-modulus counter,
   wherein the timing controller is adapted to output valid, address and time residual signals to the multi-stage filter to control timing of the filter output and kernel interpolation.

9. The instrument of claim 8, wherein an impulse response of the multi-stage filter comprises a windowed sinc function.

10. The instrument of claim 8, wherein the interpolation by the multi-stage filter is one of linear, cubic, quadratic, or Farrow-type interpolation.

11. A method of processing a first waveform having a first sample rate, said method comprising:
    applying the first waveform to a multi-stage filter adapted to re-sample the first waveform into a second waveform having a second sample rate different than the first sample rate using a shaping function; and
    controlling a timing of the multi-stage filter using a dual-modulus counter.
    wherein the dual-modulus counter comprises a Multi-stAge noise Shaping Digital Delta-Sigma Modulator (MASH DDSM).

12. The method of claim 11, wherein the second sample rate is a sample rate of an instrument containing the multi-stage filter, which is different than the first sample rate.

13. The method of claim 11, wherein the first waveform is input in real time from a source generating the first waveform.

14. The method of claim 11, wherein the shaping function of the filter comprises a windowed sinc function.

15. The method of claim 11, wherein controlling the timing of the filter using a dual-modulus counter comprises operating a Multi-stAge noise Shaping Digital Delta-Sigma Modulator (MASH DDSM) using a state machine that outputs valid, address and time residual signals to control timing of the filter output and kernel interpolation.

16. The method of claim 15, wherein the interpolation by the multi-stage filter is one of linear, cubic, quadratic, or Farrow-type interpolation.

* * * * *